United States Patent
Beak et al.

(10) Patent No.: US 9,093,330 B2
(45) Date of Patent: Jul. 28, 2015

(54) ARRAY SUBSTRATE FOR DISPLAY DEVICE AND METHOD OF FABRICATING THE SAME

(71) Applicant: LG Display Co., Ltd., Seoul (KR)

(72) Inventors: Jung-Sun Beak, Paju-si (KR); Min-Joo Kim, Yeongdeungpo-gu (KR); Jeong-Oh Kim, Goyang-si (KR); Jeong-Gi Yun, Paju-si (KR); Yong-Min Kim, Anyang-si (KR)

(73) Assignee: LG Display Co., Ltd., Seoul (KR)

( * ) Notice: Subject to any disclaimer, the term of this patent is extended or adjusted under 35 U.S.C. 154(b) by 0 days.

(21) Appl. No.: 14/541,063

(22) Filed: Nov. 13, 2014

(65) Prior Publication Data

US 2015/0144910 A1    May 28, 2015

(30) Foreign Application Priority Data

Nov. 27, 2013   (KR) .................. 10-2013-0145631
May 28, 2014   (KR) .................. 10-2014-0064588

(51) Int. Cl.
  *H01L 27/32* (2006.01)
  *H01L 27/12* (2006.01)

(52) U.S. Cl.
  CPC ........ *H01L 27/1255* (2013.01); *H01L 27/1225* (2013.01); *H01L 27/3244* (2013.01)

(58) Field of Classification Search
  CPC .................................................. H01L 27/3265
  See application file for complete search history.

(56) References Cited

U.S. PATENT DOCUMENTS

| | | | |
|---|---|---|---|
| 2002/0000551 A1* | 1/2002 | Yamazaki et al. | ............... 257/59 |
| 2007/0152217 A1* | 7/2007 | Lai et al. | ......................... 257/59 |

* cited by examiner

*Primary Examiner* — Lex Malsawma
(74) *Attorney, Agent, or Firm* — Fenwick & West LLP

(57) ABSTRACT

An array substrate for a display device includes a first thin film transistor (TFT) including a first semiconductor layer, a first gate electrode corresponding to the first semiconductor layer, a first source electrode and a first drain electrode; a second TFT including a second semiconductor layer, a second gate electrode corresponding to the second semiconductor layer, a second source electrode and a second drain electrode; a first transparent capacitor electrode connected to the first drain electrode; a first passivation layer on the first transparent capacitor electrode; a second transparent capacitor electrode on the first passivation layer and connected to the second drain electrode, the second transparent capacitor electrode overlapping the first transparent capacitor electrode; a second passivation layer on or over the first passivation layer and the second transparent capacitor electrode; and a first electrode on the second passivation layer and connected to the second transparent capacitor electrode.

18 Claims, 12 Drawing Sheets

ARRAY SUBSTRATE FOR DISPLAY DEVICE AND METHOD OF FABRICATING THE SAME

The present application claims the benefit of Korean Patent Application No. 10-2013-0145631 filed in Korea on Nov. 27, 2013, and Korean Patent Application No. 10-2014-0064588, filed in Korea on May 28, 2014, all of which are herein incorporated by reference.

BACKGROUND

1. Field of Art

The present invention relates to a display device and more particularly to an array substrate for a display device including a storage capacitor without decrease of aperture ratio and a method of fabricating the array substrate by reduced a number of mask processes.

2. Discussion of the Related Art

A cathode ray tube (CRT) has been widely used as a display device. Recently, however, a flat panel display device, for example, a plasma display panel (PDP) device, a liquid crystal display (LCD) device and an organic light emitting diode (OLED) display device, is used as a display device instead of the CRT.

Among these flat panel display devices, the OLED display device has an advantage in thickness and weight because the OLED display device does not require a backlight unit. The OLED display device is a self-emission type display device. Recently, the OLED display device is used for a large display device.

FIG. 1 is a cross-sectional view of an array substrate for the related art OLED display device.

As shown in FIG. 1, in the array substrate for the OLED display device, a gate line (not shown) and a data line 32 are formed on and over a substrate 10. The gate line and the data line 32 cross each other to define a pixel region on the substrate 10. In addition, a common voltage line (not shown) may be formed in each pixel region to be parallel to the data line 32.

First and second thin film transistors (TFTs) TR1 and TR2 are formed at a crossing portion of the gate line and the data line 32. The first and second TFTs TR1 and TR2 serve as a switching element and a driving element, respectively.

The first TFT TR1 includes a first semiconductor layer 17, a first gate electrode 11, a first source electrode 12 and a first drain electrode 13. The first gate electrode 11 is spaced apart from the first semiconductor layer 17 by a gate insulating layer 14. An interlayer insulating layer 31 covers the first gate electrode 11 and includes contact holes exposing both ends of the first semiconductor layer 17. The first source electrode 12 and the first drain electrode 13 are formed on the interlayer insulating layer 31 and are respectively connected to the first semiconductor layer 17 through the contact holes in the interlayer insulating layer 31.

The second TFT TR1 includes a first semiconductor layer 27, a second gate electrode 21, a second source electrode 22 and a second drain electrode 23. The second gate electrode 21 is spaced apart from the second semiconductor layer 27 by the gate insulating layer 14. The interlayer insulating layer 31 covers the second gate electrode 21 and includes contact holes exposing both ends of the second semiconductor layer 27. The second source electrode 22 and the second drain electrode 23 are formed on the interlayer insulating layer 31 and are respectively connected to the second semiconductor layer 27 through the contact holes in the interlayer insulating layer 31.

The first source electrode 12 is connected to the data line 32, and the second source electrode 22 is connected to the common voltage line.

The first drain electrode 13 of the first TFT TR1 is connected to a second capacitor electrode 16, and the second drain electrode 23 is connected to a first capacitor electrode 15. The second capacitor electrode 16 overlaps the first capacitor electrode 15 to form a storage capacitor Cst.

An anode electrode 19 is formed to be electrically connected to the second drain electrode 23. In addition, an organic emitting layer (not shown) and a cathode electrode (not shown) are stacked on the anode electrode (19) such that the array substrate for the OLED display device is formed.

In the OLED display device, a hole from the anode electrode 19 and an electron from the cathode electrode are combined in the organic emitting layer such that light is emitted from the organic emitting layer. When the cathode electrode is formed of an opaque metallic material, the light from the organic emitting layer passes through the substrate 10 including the first and second TFTs TR1 and TR2.

A voltage for controlling an electric current of a pixel is charged in a storage capacitor Cst such that a level of the electric current is maintained to next frame. When a surface area (or area) of the storage capacitor Cst is enlarged to improve driving security, the aperture ratio is reduced because the first and second capacitor electrodes 15 and 16 are formed of an opaque metallic material.

To resolve the above problem, often the area of the storage capacitor Cst is optimized to have a minimum capacitance for a pixel driving. However, since a number of pixels in a unit area are increased according to high resolution, an area of each pixel is decreased. As a result, it is very difficult to form a storage capacitor in the pixel. On the other hand, a multi-structure type storage capacitor is introduced. However, a fabricating process for the multi-structure type storage capacitor is complicated such that production yield is reduced.

SUMMARY

An array substrate for an OLED display device and a method of fabricating the same is described herein.

In one embodiment, an array substrate for a display device includes a first thin film transistor (TFT) including a first semiconductor layer, a first gate electrode corresponding to the first semiconductor layer, a first source electrode and a first drain electrode; a second TFT including a second semiconductor layer, a second gate electrode corresponding to the second semiconductor layer, a second source electrode and a second drain electrode; a first transparent capacitor electrode connected to the first drain electrode; a first passivation layer on the first transparent capacitor electrode; a second transparent capacitor electrode on the first passivation layer and connected to the second drain electrode, the second transparent capacitor electrode overlapping the first transparent capacitor electrode; a second passivation layer on or over the second transparent capacitor electrode; and a first electrode on the second passivation layer and connected to the second transparent capacitor electrode.

In another embodiment, an array substrate for a display device includes a first thin film transistor (TFT) including a first semiconductor layer, a first gate electrode corresponding to the first semiconductor layer, a first source electrode and a first drain electrode; a second TFT including a second semiconductor layer, a second gate electrode corresponding to the second semiconductor layer, a second source electrode and a second drain electrode; a first transparent capacitor electrode connected to the first drain electrode or the second semiconductor layer; an interlayer insulating layer on the first transparent capacitor electrode; a second transparent capacitor electrode on the interlayer insulating layer and connected to the second drain electrode, the second transparent capacitor electrode overlapping the first transparent capacitor electrode; a first passivation layer over the second transparent capacitor electrode; and a first electrode on the first passivation layer and connected to the second drain electrode.

In another embodiment, an array substrate for a display device includes a first thin film transistor (TFT) including a first semiconductor layer, a first gate electrode corresponding to the first semiconductor layer, a first source electrode and a first drain electrode; a second TFT including a second semiconductor layer, a second gate electrode corresponding to the second semiconductor layer, a second source electrode and a second drain electrode; a first transparent capacitor electrode electrically coupled to at least one of the first drain electrode and the second semiconductor layer; a first nonconductive layer on the first transparent capacitor electrode; a second transparent capacitor electrode on the first nonconductive layer overlapping the first transparent capacitor electrode, the second transparent capacitor electrode electrically coupled to the second drain electrode; a second nonconductive layer on or over at least the second transparent capacitor electrode; and an anode electrode on the second nonconductive layer and electrically coupled to at least one of the second transparent capacitor electrode and the second drain electrode.

It is to be understood that both the foregoing summary and the following detailed description are merely exemplary and explanatory, and are not intended to limit the scope of the invention, examples of which are set forth in the claims. Additional features and advantages of the array substrate and method for its fabrication are set forth in the description that follows, and in part will be apparent from the description, or may be learned by practice of the description.

BRIEF DESCRIPTION OF THE DRAWINGS

The Figures (FIGS.) and the following description relate to exemplary embodiments by way of illustration only. It should be noted that from the following discussion, alternative embodiments of the structures and methods disclosed herein will be readily recognized as viable alternatives that may also be employed.

DETAILED DESCRIPTION

Figure 1:
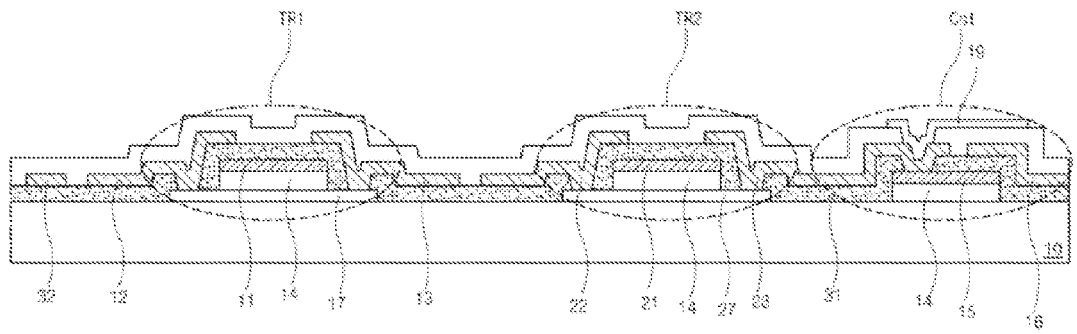
FIG. 1 is a cross-sectional view of an array substrate for the related art OLED display device.
Figure 2:
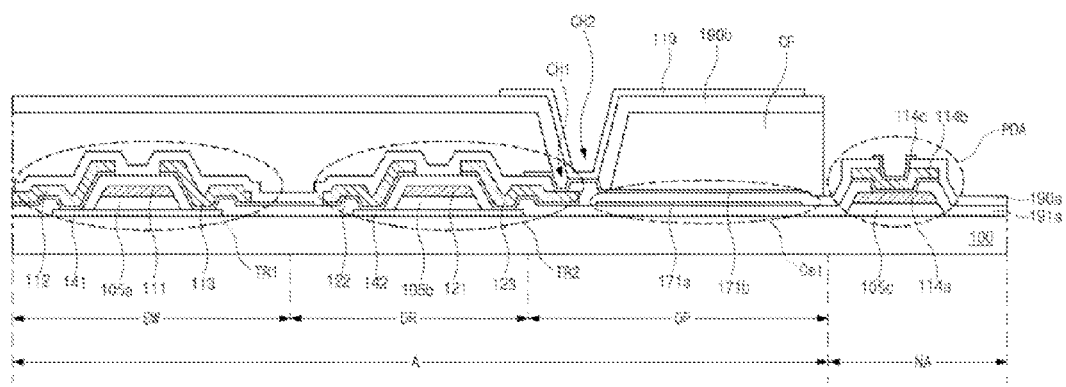
FIG. 2 is a cross-sectional view of an array substrate for an OLED display device according to a first embodiment.

FIG. 2 is a cross-sectional view of an array substrate for an OLED display device according to a first embodiment. As shown in FIG. 2, a display region "A" and a non-display region "NA" are defined in a substrate of an array substrate for an OLED display device. Each of a plurality of pixels in the display region "A" includes a switching region "SW" for a first TFT TR1 as a switching element, a driving region "DR" for a second TFT TR2 as a driving element and an opening region "OP" for a storage capacitor Cst. In addition, a pad region "PDA" for a gate pad and/or a data pad is defined in the non-display region "NA".

The first TFT TR1 includes a first semiconductor layer 141 on a substrate 100, a first gate electrode 111 over and corresponding to the first semiconductor layer 141, a first source electrode 112 over the first gate electrode 111 and a first drain electrode 113 over the first gate electrode 111. The first gate electrode 111 is spaced apart from the first semiconductor layer 141 by a first gate insulating pattern 105a. An interlayer insulating layer 191a is formed to cover the first gate electrode 111 and the first semiconductor layer 141 except both end portions. An interlayer insulating layer is one example of a layer that is nonconductive. The interlayer insulating layer 191a includes first and second semiconductor contact holes respectively exposing both end portions of the first semiconductor layer 141. The first source electrode 112 and the first drain electrode 113 are disposed on the interlayer insulating layer 191a and are electrically connected (or electrically coupled) to the first semiconductor layer 141 through the first and second semiconductor contact holes, respectively.

The second TFT TR1 includes a second semiconductor layer 142 on the substrate 100, a second gate electrode 121 over and corresponding to the second semiconductor layer 142, a second source electrode 122 over the second gate electrode 121 and a second drain electrode 123 over the second gate electrode 121. The second gate electrode 121 is spaced apart from the second semiconductor layer 142 by a second gate insulating pattern 105b. The interlayer insulating layer 191a is formed to cover the second gate electrode 121 and the second semiconductor layer 142 except both end portions. The interlayer insulating layer 191a includes third and fourth semiconductor contact holes respectively exposing both end portions of the second semiconductor layer 142. The second source electrode 122 and the second drain electrode 123 are disposed on the interlayer insulating layer 191a and are electrically connected to the second semiconductor layer 142 through the third and fourth semiconductor contact holes, respectively.

A first passivation layer 190a is formed on the first and second TFTs TR1 and TR2 and on or over the interlayer insulating layer 191a and includes a first contact hole "CH1" exposing the second drain electrode 123. A passivation layer is another example of a layer that is nonconductive.

The storage capacitor Cst includes a first transparent capacitor electrode 171a on the interlayer insulating layer 191a and a second transparent capacitor electrode 171b on the first passivation layer 190a. The second transparent capacitor electrode 171b overlaps the first transparent capacitor electrode 171a.

In the pad region "PDA", a third gate insulating pattern 105c and the first pad electrode 114a are formed on the substrate 100. The interlayer insulating layer 191a, which includes a first pad contact hole exposing the first pad electrode 114a, is formed on the first pad electrode 114a. A second pad electrode 114b, which is electrically connected to the first pad electrode 114a through the first pad contact hole in the interlayer insulating layer 191a, is formed on the interlayer insulating layer 191a. A first passivation layer 190a, which includes a second pad contact hole exposing the second pad electrode 114b, is formed on the second pad electrode 114b, and a third pad electrode 114c, which is electrically connected to the second pad electrode 114b through the second pad contact hole in the first passivation layer 190a, is formed on the first passivation layer 190a.

In addition, in the switching region "SW", the driving region "DR" and the opening region "OP", a color filter "CF" is disposed on the first passivation layer 190a. A second passivation layer 190b is formed on the color filter "CF". The second passivation layer 190b and the color filter "CF" include a second contact hole "CH2" exposing the second transparent capacitor electrode 171b.

A first electrode 119 as an anode electrode is disposed on the second passivation layer 190b. The first electrode 119 contacts the second transparent capacitor electrode 171b through the second contact hole "CH2". In addition, an organic emitting layer (not shown) and a cathode electrode (not shown) are stacked on the first electrode 119 to form an organic emitting diode. The array substrate including the first and second TFTs TR1 and TR2, the storage capacitor Cst and the organic emitting diode may be encapsulated to form the OLED display device.

The first gate electrode 111 and the first source electrode 112 of the first TFT TR1 are respectively connected to a gate line (not shown) and a data line (not shown). The first drain electrode 113 of the first TFT TR1 is connected to the second gate electrode 121 of the second TFT TR2. As a result, when the first TFT TR1 is switched on by a signal to the first gate electrode 111, a signal from the data line is applied to the second gate electrode 121 through the first source electrode 112 and the first drain electrode 113. In addition, the second source electrode 122 is connected to a common voltage line (not shown). As a result, when the second TFT TR2 is switched on by the signal from the first drain electrode 113, the voltage from the common voltage line is applied to the first electrode 119 through the second drain electrode 123.

The first drain electrode 113 includes a double-layered structure. For example, the first drain electrode 113 may includes a transparent conductive material layer as a lower layer and a metallic material layer as an upper layer. The metallic material layer may be opaque. The lower layer of the first drain electrode 113 extends into a pixel region to form the first transparent capacitor electrode 171a. In addition, the first source electrode 112, the second source electrode 122, the second drain electrode 123 and the second pad electrode 114b may also have the same double-layered structure as the first drain electrode 113. For clarity, in the figures each of these double layers is only marked by a reference line and reference numeral pointing to one of the layers (e.g., the metallic material layer), however the double layers and their respective reference numerals refer to both the metallic and transparent conductive layers, unless otherwise noted (e.g., such as in FIGS. 5B and 5C separately labeling the transparent conductive 215 and metal layers 216.).

The second transparent capacitor electrode 171b is electrically connected to the second drain electrode 123 through the first contact hole "CH1" in the first passivation layer 190a. As a result, the second transparent capacitor electrode 171b receives a voltage from the second drain electrode 123. The second transparent capacitor electrode 171b extends into the pixel region to overlap the first transparent capacitor electrode 171a. As a result, the first transparent capacitor electrode 171a, the second transparent capacitor electrode 171b and the first passivation layer 190a therebetween constitute the storage capacitor Cst. The storage capacitor is transparent owing to the user of the transparent conductive layer that is also used in one of the layers of the double-layered structure of the first drain electrode 113 and/or other elements such as the first source electrode 112, the second source electrode, and the second drain electrode 123.

The storage capacitor can occupy an entire area of the pixel region (display area) except the switching region "SW" for the first TFT TR1 and the driving region "DR" for the second TFT TR2. Since the capacitor electrodes, i.e., the first and second transparent capacitor electrodes 171a and 171b, are transparent, capacitance is improved without decrease of the aperture ratio.

For example, the first and second capacitor electrodes 171a and 171b may be formed of indium-tin-oxide (ITO) having a light transmittance above about 70%. However, when the material for the first and second capacitor electrodes 171a and 171b has the same or the improved transmittance and electrical property, it is not limited thereto.

The first and second semiconductor layers 141 and 142 are formed of low temperature poly-silicon (LTPS) or an oxide semiconductor material.

FIG. 2 shows a coplanar type first and second TFTs TR1 and TR2. However, it is not limited thereto. For example, bottom gate type TFTs may also be used with a similar capacitor structure and with the same materials, thereby achieving the same result of an increased storage capacity without decreasing the aperture ratio of the display device.

Figure 3A:
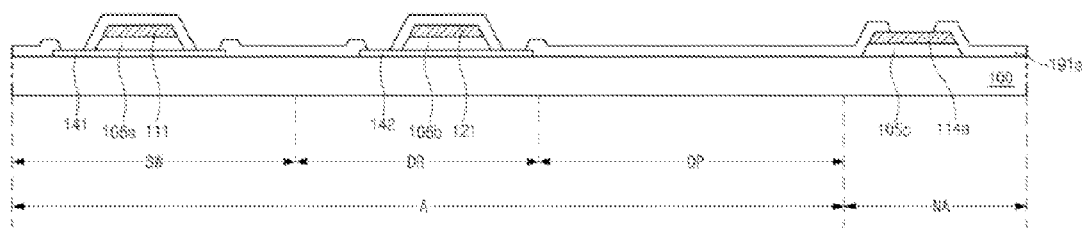
FIGS. 3A to 3H are cross-sectional views illustrating a fabricating process of the array substrate for the OLED display device according to the first embodiment.

FIGS. 3A to 3H are cross-sectional views illustrating a fabricating process of the array substrate for the OLED display device according to the first embodiment. As shown in FIG. 3A, the first and second semiconductor layers 141 and 142 are formed on the substrate 100 and in the switching region "SW" and the driving region "DR", respectively. An insulating material layer (not shown) and a metal layer (not shown) are sequentially formed on the substrate 100 including the first and second semiconductor layers 141 and 142. The inorganic insulating material layer (not shown) and a metal layer (not shown) are patterned to form the first to third gate insulating patterns 105a, 105b and 105c, the first and second gate electrode 111 and 121 and the first pad electrode 114a. In addition, the gate line (not shown) is formed. For example, the gate insulating patterns 105a, 105b and 105c may be formed of silicon oxide or silicon nitride, and the first and second gate electrode 111 and 121 and the first pad electrode 114a may be formed of a low resistance metallic material, e.g., copper (Cu), Cu alloy, aluminum (Al), Al alloy, molybdenum (Mo) or Mo-titanium alloy (MoTi).

Next, an insulating material layer (not shown) is formed on the substrate 100 including the first and second gate electrode 111 and 121 and the first pad electrode 114a. The insulating layer is patterned to form the interlayer insulating layer 191a including the first to fourth semiconductor contact holes and the first pad contact hole exposing the first pad electrode 114a.

Figure 3B:
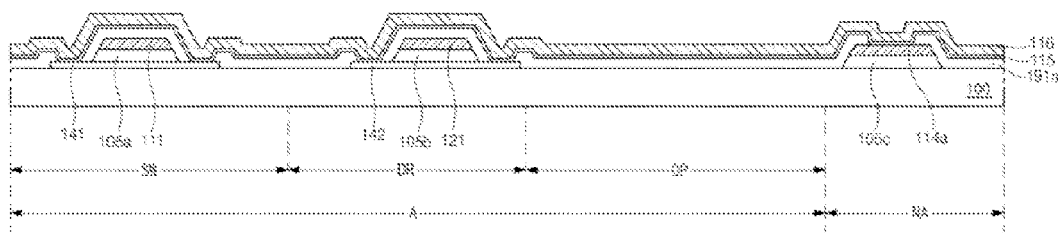

Next, as shown in FIG. 3B, a first transparent conductive material layer 115 and a metal layer 116 are sequentially formed on the substrate 100 including the interlayer insulating layer 191a. Since the interlayer insulating layer 191a includes the first to fourth semiconductor contact holes and the first pad contact hole, the first transparent conductive material layer 115 contacts both ends of the first semiconductor layer 141, both ends of the second semiconductor 142 and the first pad electrode 114a. For example, the first transparent conductive material layer 115 is formed of ITO, and the metal layer 116 is formed a low resistance opaque metallic material, e.g., copper (Cu), Cu alloy, aluminum (Al), Al alloy, molybdenum (Mo) or Mo-titanium alloy (MoTi).

Figure 3C:
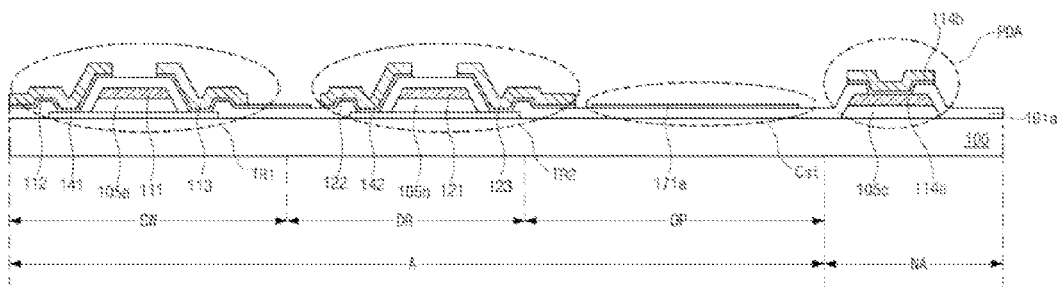

Next, as shown in FIG. 3C, the metal layer 116 (of FIG. 3B) and the first transparent conductive material layer 115 (of FIG. 3B) are patterned to form the first source electrode 112 and the first drain electrode 113 in the switching region "SW", the second source electrode 122 and the second drain electrode 123 in the driving region "DR" and the second pad electrode 114b in the pad region "PDA". Each of the first source electrode 112, the first drain electrode 113, the second source electrode 122, the second drain electrode 123 and the second pad electrode 114b has a double-layered structure. The first source electrode 112 contacts one end of the first semiconductor layer 141 through the first semiconductor contact hole, and the first drain electrode 113 contacts the other end of the first semiconductor layer 141 through the second semiconductor contact hole. The second source electrode 122 contacts one end of the second semiconductor layer 142 through the third semiconductor contact hole, and the second drain electrode 123 contacts the other end of the second semiconductor layer 142 through the fourth semiconductor contact hole. The second pad electrode 114b contacts the first pad electrode 114a through the first pad contact hole.

In addition, the first transparent capacitor electrode 171a is formed in the opening region "OP". In the opening region "OP", the metal layer 116 is completely removed or etched such that the first transparent capacitor electrode 171a has a single-layered structure of the first transparent conductive material layer 115. The first transparent capacitor electrode 171a extends from the lower layer of the first drain electrode 113.

In addition, the data line (not shown) and the common voltage line are formed on the interlayer insulating layer 191a. Each of the data line and the common voltage line also has the double-layered structure described above including both a transparent electrode material and an opaque electrode material. The data line crosses the gate line to define the pixel region and is connected to the first source electrode 112. The common voltage line is spaced apart from and parallel to the data line. The common voltage line is connected to the second source electrode 122.

The patterning process for the first transparent conductive material layer 115 and the metal layer 116 is performed using a half-tone mask such that a number of the mask processes is not increased.

In more detail, after forming the metal layer 116, a first photoresist (PR) pattern (not shown), which corresponds to the first and second source electrodes 112 and 122, the first and second drain electrodes 113 and 123, the second pad electrode 114b and the data line, and a second PR pattern (not shown), which correspond to the first transparent capacitor electrode 171a and has a thickness smaller than the first PR pattern, are formed on the metal layer 116 using the half-tone mask (not shown) including a transmitting region, a blocking region and a half-transmitting region. Then, the metal layer 116 and the first transparent conductive material layer 115 are etched using the first and second PR patterns as an etching mask to form the first and second source electrodes 112 and 122, the first and second drain electrodes 113 and 123, the second pad electrode 114b, the data line and a capacitor electrode pattern (not shown). In this instance, each of the first and second source electrodes 112 and 122, the first and second drain electrodes 113 and 123, the second pad electrode 114b, the data line and a capacitor electrode pattern has a double-layered structure. Then, an ashing process is performed to remove the second PR pattern and reduce the thickness of the first PR pattern such that an upper layer of the capacitor electrode pattern is exposed. The upper layer of the capacitor electrode pattern is etched such that the first transparent capacitor electrode 171a having a single-layered structure is formed.

Resistance of the first source electrode 112, the first drain electrode 113, the second source electrode 122, the second drain electrode 123, the data line and the common voltage line is reduced due to the metal layer on the first transparent conductive material layer.

Figure 3D:
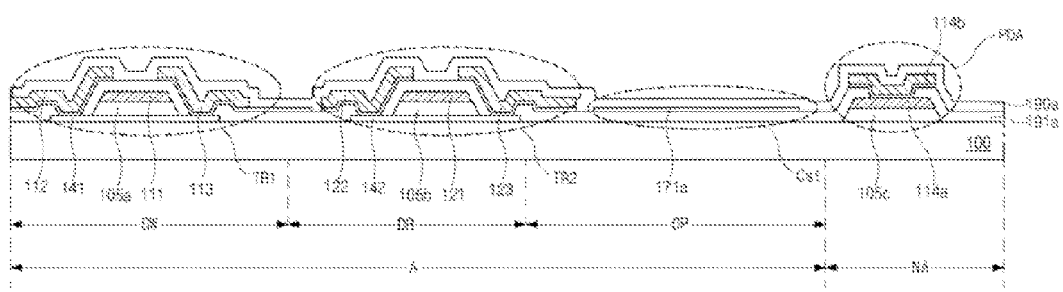

Next, as shown in FIG. 3D, the first passivation layer 190a is formed. The first passivation layer 190a is disposed on the first and second source electrodes 112 and 122, the first and second drain electrodes 113 and 123, the second pad electrode 114b and the first transparent capacitor electrode 171a.

Figure 3E:
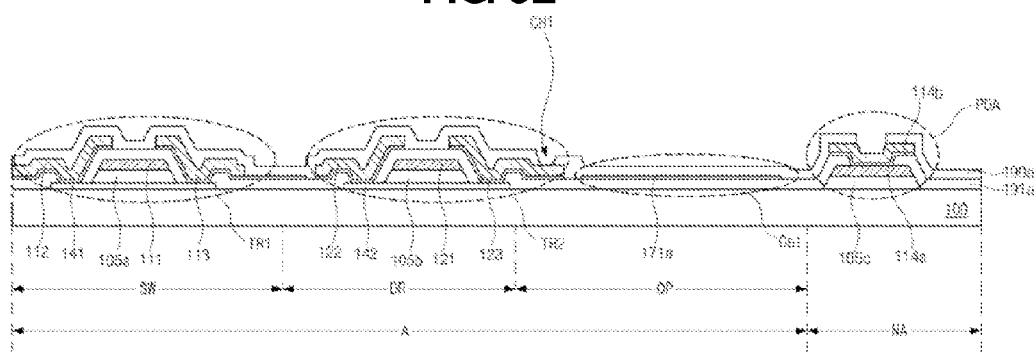

Next, as shown in FIG. 3E, the first passivation layer 190a is patterned such that the first contact hole "CH1" and the second pad contact hole are formed through the first passivation layer 190a. The second drain electrode 123 is exposed through the first contact hole "CH1", and the second pad electrode 114b is exposed through the second pad contact hole.

Figure 3F:
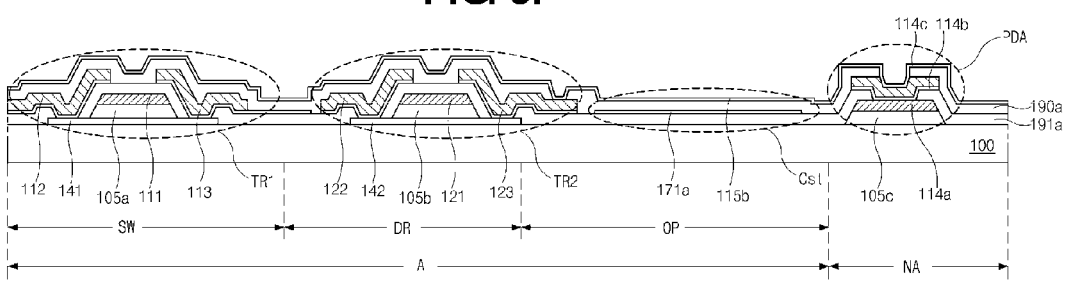

Next, as shown in FIG. 3F, a second transparent conductive material layer 115b is formed on the first passivation layer 190a. The second transparent conductive material layer 115b contacts the second drain electrode 123 through the first contact hole "CH1" and the second pad electrode 114b through the second pad contact hole.

Figure 3G:
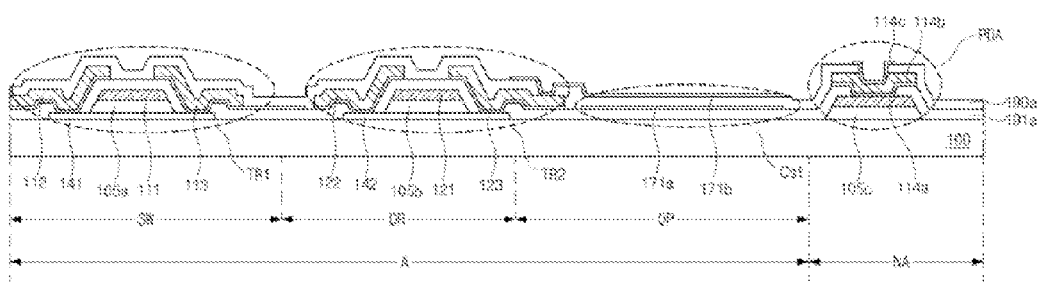

Next, as shown in FIG. 3G, the second transparent conductive material layer 115b (of FIG. 3F) is patterned to form the second transparent capacitor electrode 171b in the opening region "OP" and the third pad electrode 114c in the pad region "PAD".

The second transparent capacitor electrode 171b is electrically connected to the second drain electrode 123 through the first contact hole "CH1" and overlaps the first transparent capacitor electrode 171a. As a result, the first capacitor electrode 171a, the second capacitor electrode 171b and the first passivation layer 190a therebetween constitute the storage capacitor Cst. In addition, the third pad electrode 114c is electrically connected to the second pad electrode 114b through the second pad contact hole.

Figure 3H:
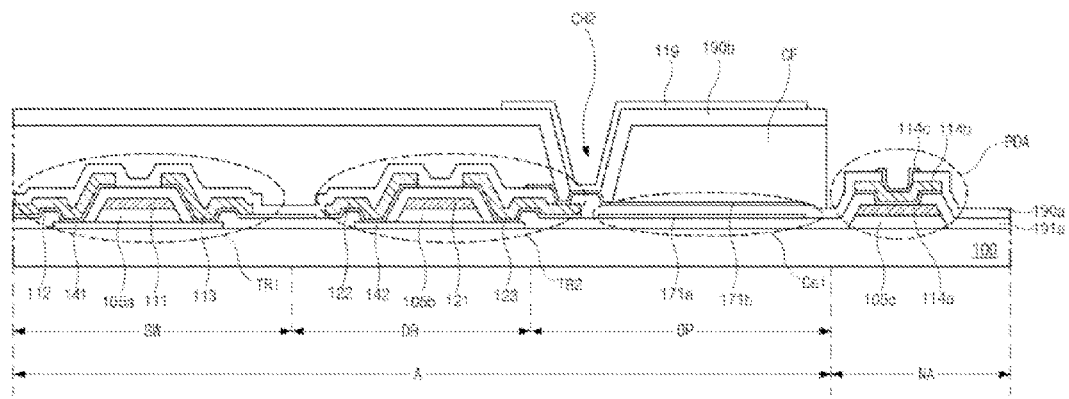

Next, as shown in FIG. 3H, the color filter "CF" is formed on the second transparent capacitor electrode 171b and the first passivation layer 190a. However, the color filter "CF" can be omitted. An organic insulating layer (not shown) is formed on the color filter "CF" and the third pad electrode 141c. The organic insulating layer and the color filter "CF" are patterned to form the second passivation layer 190b and the second contact hole "CH2" through the second passivation layer 190b and the color filter "CF".

Next, the first electrode 119, which contacts the second transparent capacitor electrode 171b through the second contact hole "CH2" is formed on the second passivation layer 190b. Namely, the first electrode 119 is electrically connected to the second drain electrode 123.

Since the first and second source electrodes 112 and 122, the first and second drain electrodes 113 and 123 and the first transparent capacitor electrode 171a are formed by a single mask process, the array substrate of the present invention is fabricated by the same mask process as the related art array substrate including an opaque capacitor electrode. In addition, the storage capacitor in the present invention can be formed in an entire area of the opening region "OP", and the aperture ratio of the array substrate in the present invention is increase by about 24% in comparison to the related art array substrate.

Particularly, since the storage capacitor in the present invention can be formed in an entire area of the opening region "OP" without decrease of the aperture ratio, the capacitance of the storage capacitor is increased such that the driving property of the OLED display device is improved.

On the other hand, although not shown, the organic emitting layer and the cathode electrode are formed on the first electrode by a conventional process.

Figure 4:
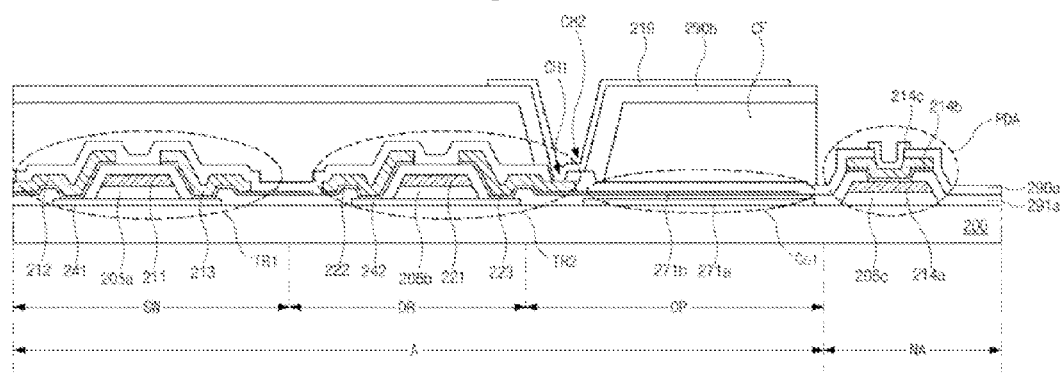
FIG. 4 is a cross-sectional view of an array substrate for an OLED display device according to a second embodiment.

FIG. 4 is a cross-sectional view of an array substrate for an OLED display device according to a second embodiment. As shown in FIG. 4, a display region "A" and a non-display region "NA" are defined in a substrate of an array substrate for an OLED display device. Each of a plurality of pixels in the display region "A" includes a switching region "SW" for a first TFT TR1 as a switching element, a driving region "DR" for a second TFT TR2 as a driving element and an opening region "OP" for a storage capacitor Cst. In addition, a pad region "PAD" for a gate pad and/or a data pad is defined in the non-display region "NA".

The first TFT TR1 includes a first semiconductor layer 241 on a substrate 200, a first gate electrode 211 over the first semiconductor layer 241, a first source electrode 212 over the first gate electrode 211 and a first drain electrode 213 over the first gate electrode 211. The first gate electrode 211 is spaced apart from the first semiconductor layer 241 by a first gate insulating pattern 205a. An interlayer insulating layer 291a is formed to cover the first gate electrode 211 and the first semiconductor layer 241 except both end portions. The interlayer insulating layer 291a includes first and second semiconductor contact holes respectively exposing both end portions of the first semiconductor layer 241. The first source electrode 212 and the first drain electrode 213 are disposed on the interlayer insulating layer 291a and are electrically connected to the first semiconductor layer 241 through the first and second semiconductor contact holes, respectively.

The second TFT TR1 includes a second semiconductor layer 242 on the substrate 200, a second gate electrode 221 over the second semiconductor layer 242, a second source electrode 222 over the second gate electrode 221 and a second drain electrode 223 over the second gate electrode 221. The second gate electrode 221 is spaced apart from the second semiconductor layer 242 by a second gate insulating pattern 205b. The interlayer insulating layer 291a is formed to cover the second gate electrode 221 and the second semiconductor layer 242 except both end portions. The interlayer insulating layer 291a includes third and fourth semiconductor contact holes respectively exposing both end portions of the second semiconductor layer 242. The second source electrode 222 and the second drain electrode 223 are disposed on the interlayer insulating layer 291a and are electrically connected to the second semiconductor layer 242 through the third and fourth semiconductor contact holes, respectively.

The storage capacitor Cst includes a first transparent capacitor electrode 271a on the substrate 200 and a second transparent capacitor electrode 271b on the interlayer insulating layer 291a. The first transparent capacitor electrode 271a is spaced apart from the second semiconductor layer 242 and is formed of the same material and disposed at the same layer as the first and second semiconductor layers 241 and 242. The first transparent capacitor electrode 271a may be also spaced apart from the first semiconductor layer 241. The second transparent capacitor electrode 271b overlaps the first transparent capacitor electrode 271a.

The first transparent capacitor electrode 271a is electrically connected to the first drain electrode 213 or the first semiconductor layer 241. The second transparent capacitor electrode 271b is electrically connected to the second drain electrode 223. As a result, the first transparent capacitor electrode 271a, second transparent capacitor electrode 271b and the interlayer insulating layer 291a therebetween constitute the storage capacitor Cst.

In the pad region "PAD", a third gate insulating pattern 105c and the first pad electrode 114a are formed on the substrate 100. The interlayer insulating layer 191a, which includes a first pad contact hole exposing the first pad electrode 114a, is formed on the first pad electrode 114a. A second pad electrode 114b, which is electrically connected to the first pad electrode 114a through the first pad contact hole in the interlayer insulating layer 191a, is formed on the interlayer insulating layer 191a. The first passivation layer 190a, which includes a second pad contact hole exposing the second pad electrode 114b, is formed on the second pad electrode 114b, and a third pad electrode 114c, which is electrically connected to the second pad electrode 114b through the second pad contact hole in the first passivation layer 190a, is formed on the first passivation layer 190a.

The first passivation layer 290a is formed on the first and second TFTs TR1 and TR2 and on or over the interlayer insulating layer 291a and includes a first contact hole "CH1" exposing the second drain electrode 223. In addition, in the switching region "SW", the driving region "DR" and the opening region "OP", a color filter "CF" is disposed on the first passivation layer 290a. A second passivation layer 290b is formed on the color filter "CF". The second passivation layer 290b and the color filter "CF" include a second contact hole "CH2" exposing the second transparent capacitor electrode 271b.

A first electrode 219 is disposed on the second passivation layer 290b. The first electrode 219 contacts the second transparent capacitor electrode 271b through the second contact hole "CH2". In addition, an organic emitting layer (not shown) and a cathode electrode (not shown) are stacked on the first electrode 219 to form an organic emitting diode. The array substrate including the first and second TFTs TR1 and TR2, the storage capacitor Cst and the organic emitting diode may be encapsulated to form the OLED display device.

The first gate electrode 211 and the first source electrode 212 of the first TFT TR1 are respectively connected to a gate line (not shown) and a data line (not shown). The first drain electrode 213 of the first TFT TR1 is connected to the second gate electrode 221 of the second TFT TR2. As a result, when the first TFT TR1 is switched on by a signal to the first gate electrode 211, a signal from the data line is applied to the second gate electrode 221 through the first source electrode 212 and the first drain electrode 213. In addition, the second source electrode 222 is connected to a common voltage line (not shown). As a result, when the second TFT TR2 is switched on by the signal from the first drain electrode 213, the voltage from the common voltage line is applied to the first electrode 219 through the second drain electrode 223.

The second drain electrode 223 includes a double-layered structure. For example, the second drain electrode 223 may includes a transparent conductive material layer as a lower layer and a metallic material layer as an upper layer. The metallic material layer may be opaque. The lower layer of the second drain electrode 223 extends into a pixel region to form the second transparent capacitor electrode 271b. Namely, the second transparent capacitor electrode 271b is electrically connected to the second drain electrode 223. In addition, the first source electrode 212, the first drain electrode 213 the second source electrode 222, and the second pad electrode 214b may have the same double-layered structure as the second drain electrode 223.

The first and second semiconductor layers 241 and 242 and the first transparent capacitor electrode 271a are formed of an oxide semiconductor material. For example, the first and second semiconductor layers 241 and 242 and the first transparent capacitor electrode 271a may be formed of indium-gallium-zinc-oxide (IGZO). Both ends of the first and second semiconductor layers 241 and 242 and the first transparent capacitor electrode 271a are treated by a hydrogen ($H_2$) plasma or an argon (Ar) plasma to be conductive.

The storage capacitor can occupy an entire area of the pixel region except the switching region "SW" for the first TFT TR1 and the driving region "DR" for the second TFT TR2. Since the capacitor electrodes, i.e., the first and second transparent capacitor electrodes 271a and 271b, are transparent, capacitance is improved without decrease of the aperture ratio.

For example, the first and second capacitor electrodes 271a and 271b may be formed of indium-tin-oxide (ITO) having a light transmittance above about 70%. However, when the material for the first and second capacitor electrodes 271a and 271b has the same or the improved transmittance and electrical property, it is not limited thereto.

Figure 5A:
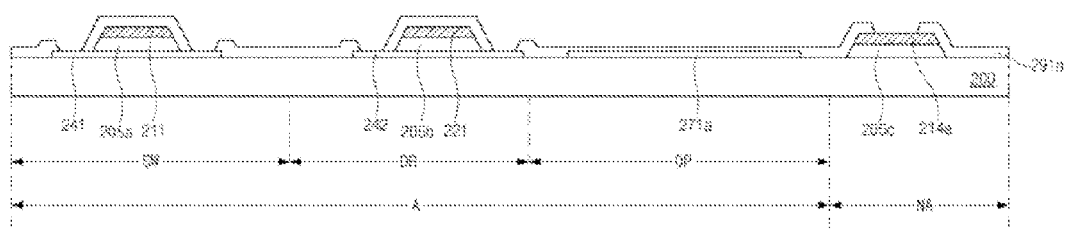
FIGS. 5A to 5H are cross-sectional views illustrating a fabricating process of the array substrate for the OLED display device according to the second embodiment.

FIGS. 5A to 5H are cross-sectional views illustrating a fabricating process of the array substrate for the OLED display device according to the second embodiment. As shown in FIG. 5A, an oxide material layer (not shown) is formed on the substrate 200. the oxide material layer is patterned to form the first and second semiconductor layers 241 and 242 and the first transparent capacitor electrode 271a in the switching region "SW", the driving region "DR" and the opening region "OP", respectively. The first and second semiconductor layers 241 and 242 and the first transparent capacitor electrode 271a are formed of an oxide semiconductor material, e.g., IGZO. When the first transparent capacitor electrode 271a is electrically connected to the second oxide semiconductor layer 242, the first transparent capacitor electrode 271a extends from the second oxide semiconductor layer 242. Alternatively, when the first transparent capacitor electrode 271a is electrically connected to the first drain electrode 213, the first transparent capacitor electrode 271a is spaced apart from the second oxide semiconductor layer 242.

An insulating material layer (not shown) and a metal layer (not shown) are sequentially formed on the substrate 200 including the first and second semiconductor layers 241 and 242 and the first transparent capacitor electrode 271a. The inorganic insulating material layer (not shown) and a metal layer (not shown) are patterned to form the first to third gate insulating patterns 205a, 205b and 205c, the first and second gate electrode 211 and 221 and the first pad electrode 214a. As a result, both ends of the first semiconductor layer 241, both ends of the second semiconductor layer 242 and the first transparent capacitor electrode 271a are exposed. In addition, the gate line (not shown) is formed.

After the inorganic insulating layer is patterned, the hydrogen plasma or the argon plasma treating process is performed onto both ends of the first semiconductor layer 241, both ends of the second semiconductor layer 242 and the first transparent capacitor electrode 271a such that both ends of the first semiconductor layer 241, both ends of the second semiconductor layer 242 and the first transparent capacitor electrode 271a becomes to be conductive. As a result, a contact property between each of the first source electrode 212 and the first drain electrode 213 and each of both ends of the first semiconductor layer 241 and between each of the second source electrode 222 and the second drain electrode 223 and each of both ends of the second semiconductor layer 242 is improved, and an ohmic contact between each of the first source electrode 212 and the first drain electrode 213 and each of both ends of the first semiconductor layer 241 and between each of the second source electrode 222 and the second drain electrode 223 and each of both ends of the second semiconductor layer 242 is generated.

Next, an insulating material layer (not shown) is formed on the substrate 200 including the first and second gate electrode 211 and 221 and the first pad electrode 214a. The insulating layer is patterned to form the interlayer insulating layer 291a including the first to fourth semiconductor contact holes and the first pad contact hole exposing the first pad electrode 214a. When the first transparent capacitor electrode 271a is electrically connected to the first drain electrode 213, the interlayer insulating layer 291a further includes a storage contact hole (not shown) exposing a portion of the first transparent capacitor electrode 271a.

Figure 5B:
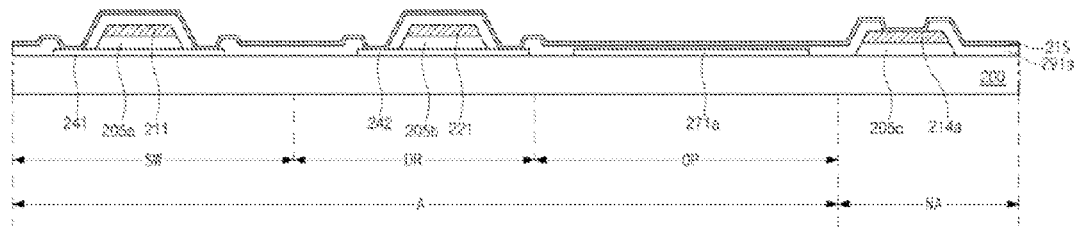
Figure 5C:
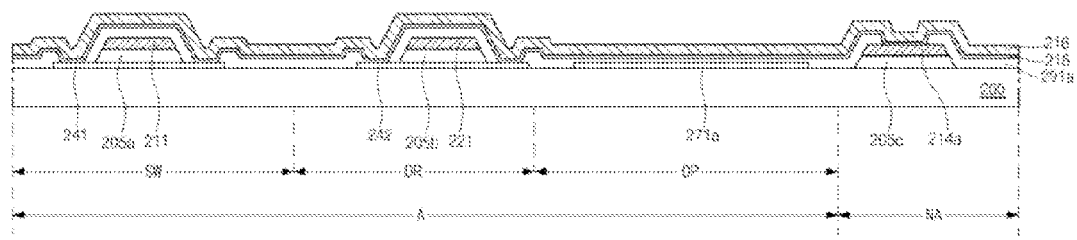

Next, as shown in FIG. 5B, a first transparent conductive material layer 215 is formed on the substrate 200 including the interlayer insulating layer 291a. Since the interlayer insulating layer 291a includes the first to fourth semiconductor contact holes and the first pad contact hole, the first transparent conductive material layer 215 contacts both ends of the first semiconductor layer 241, both ends of the second semiconductor 242 and the first pad electrode 214a. For example, the first transparent conductive material layer 215 is formed of ITO Next, as shown in FIG. 5C, a metal layer 216 is formed on the first transparent conductive material layer 215. The metal layer 116 is formed a low resistance opaque metallic material, e.g., copper (Cu), Cu alloy, aluminum (Al), Al alloy, molybdenum (Mo) or Mo-titanium alloy (MoTi).

Figure 5D:
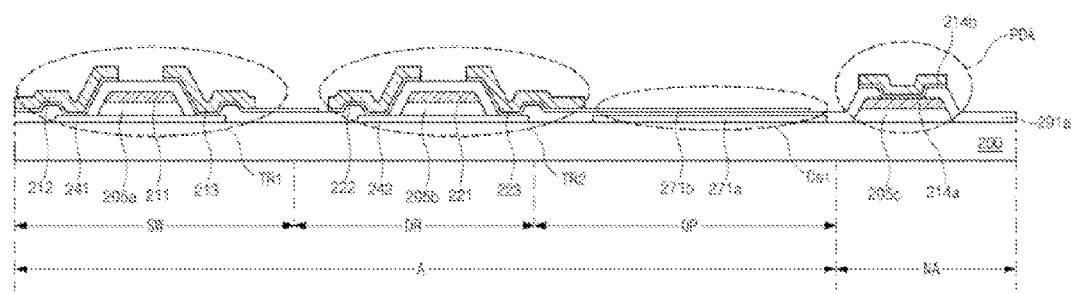

Next, as shown in FIG. 5D, the metal layer 216 (of FIG. 5C) and the first transparent conductive material layer 215 (of FIG. 5C) are patterned to form the first source electrode 212 and the first drain electrode 213 in the switching region "SW", the second source electrode 222 and the second drain electrode 223 in the driving region "DR" and the second pad electrode 114b in the pad region "PAD". Each of the first source electrode 212, the first drain electrode 213, the second source electrode 222, the second drain electrode 223 and the second pad electrode 214b has a double-layered structure. The first source electrode 212 contacts one end of the first semiconductor layer 241 through the first semiconductor contact hole, and the first drain electrode 213 contacts the other end of the first semiconductor layer 241 through the second semiconductor contact hole. The second source electrode 222 contacts one end of the second semiconductor layer 242 through the third semiconductor contact hole, and the second drain electrode 223 contacts the other end of the second semiconductor layer 242 through the fourth semiconductor contact hole. The second pad electrode 214b contacts the first pad electrode 214a through the first pad contact hole.

In addition, the second transparent capacitor electrode 271b is formed in the opening region "OP". In the opening region "OP", the metal layer 216 are completely removed such that the second transparent capacitor electrode 271b has a single-layered structure leaving only the first transparent conductive material layer 215. The second transparent capacitor electrode 271b extends from the lower layer of the second drain electrode 223.

In addition, the data line (not shown) and the common voltage line are formed on the interlayer insulating layer 291a. Each of the data line and the common voltage line also has a double-layered structure. The data line crosses the gate line to define the pixel region and is connected to the first source electrode 212. The common voltage line is spaced apart from and parallel to the data line. The common voltage line is connected to the second source electrode 222.

The patterning process for the first transparent conductive material layer 215 and the metal layer 216 is performed using a half-tone mask such that a number of the mask processes is not increased.

Resistance of the first source electrode 212, the first drain electrode 213, the second source electrode 222, the second drain electrode 223, the data line and the common voltage line is reduced due to the metal layer on the first transparent conductive material layer.

Figure 5E:
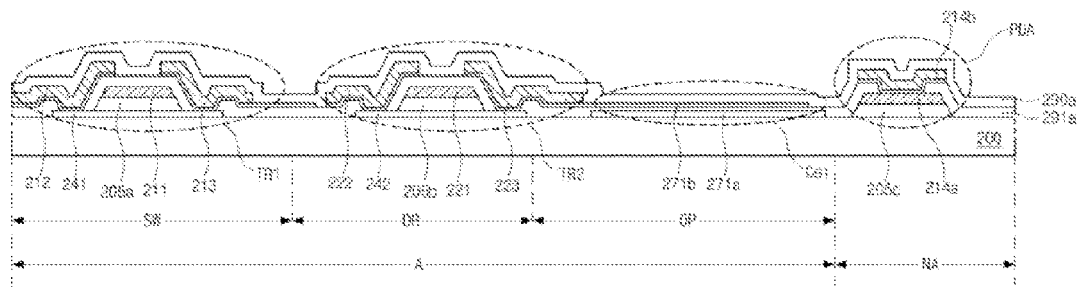

Next, as shown in FIG. 5E, the first passivation layer 290a is formed. The first passivation layer 290a is disposed on the first and second source electrodes 212 and 222, the first and second drain electrodes 213 and 223, the second pad electrode 214b and the second transparent capacitor electrode 271b.

Figure 5F:
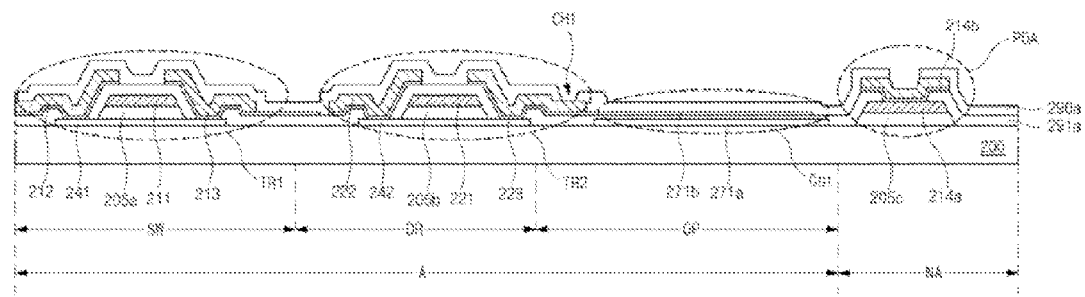

Next, as shown in FIG. 5F, the first passivation layer 290a is patterned such that the first contact hole "CH1" and the second pad contact hole are formed through the first passivation layer 290a. The second drain electrode 223 is exposed through the first contact hole "CH1", and the second pad electrode 214b is exposed through the second pad contact hole.

Figure 5G:
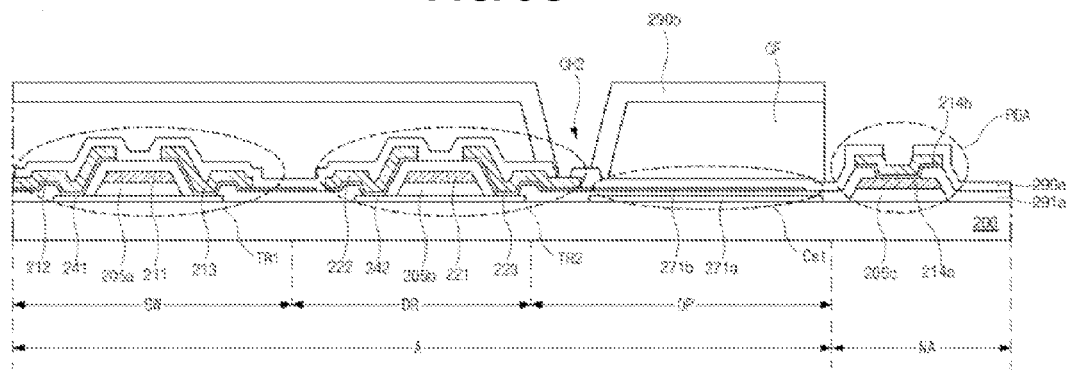

Next, as shown in FIG. 5G, the color filter "CF" is formed on the first passivation layer 290a. However, the color filter "CF" can be omitted. An organic insulating layer (not shown) is formed on the color filter "CF" and the third pad electrode 241c. The organic insulating layer and the color filter "CF" are patterned to form the second passivation layer 290b and the second contact hole "CH2" through the second passivation layer 290b and the color filter "CF". Alternatively, a single contact hole may be formed through the second passivation layer 290b, the color filter "CF" and the first passivation layer 290a to expose the second drain electrode 223.

Figure 5H:
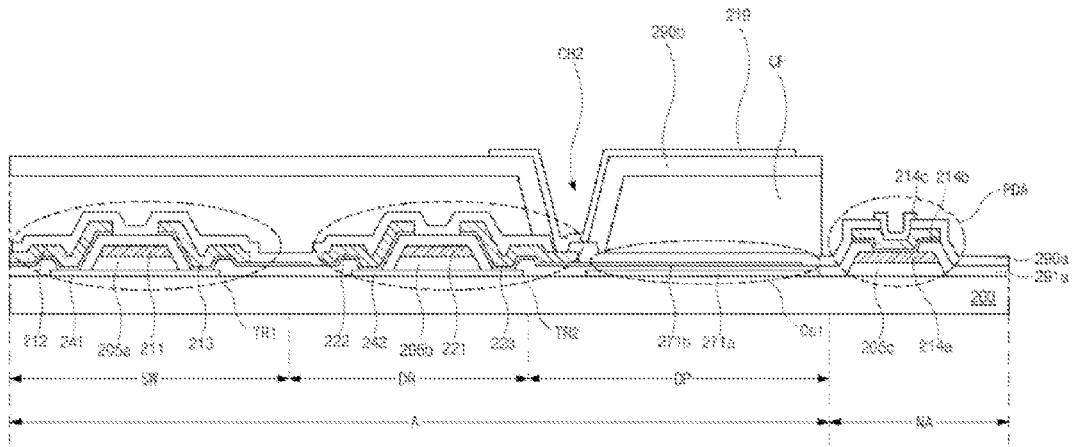

Next, as shown in FIG. 5H, the first electrode 219, which contacts the second drain electrode 223 through the first and second contact holes "CH1" and "CH2", the third pad electrode 214c, which contacts the second pad electrode 214c through the second pad contact hole, are formed on the second passivation layer 290b.

The first transparent capacitor electrode 271a is formed by the same mask process as the first and second semiconductor layers 241 and 242, and the second transparent capacitor electrode 271b is formed by the same mask process as the second drain electrode 223. As a result, the total number of the mask processes used to fabricate the array substrate is reduced. In addition, since some of the electrodes, e.g., the first and second transparent capacitor electrodes 271a and 271b, of the storage capacitor Cst are transparent, the storage capacitor Cst can be included in the display area rather than being excluded into the non-display area. As a result, the aperture ratio is improved, and the size of the capacitor is not a limiting factor on the aperture ratio. As a result, even when the storage capacitor Cst is formed to occupy, for example, an entire area of the opening region "OP", the illuminance of the OLED display device is improved.

Figure 6A:
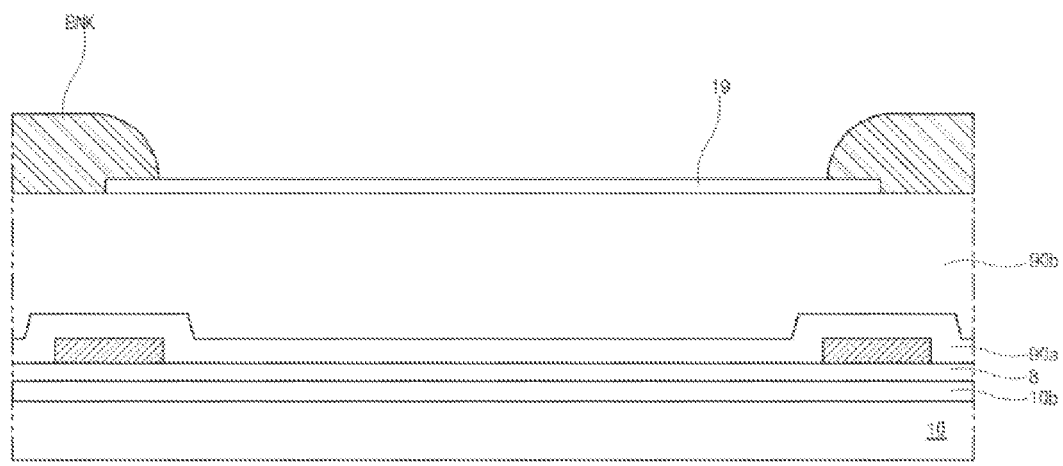
FIGS. 6A to 6C are cross-sectional views explaining a difference in the array substrates between the related art OLED display device (FIG. 6A) and the first (FIG. 6B) and second (FIG. 6C) embodiments of OLED display devices.

Referring to FIG. 6A, which is a cross-sectional view explaining the aperture ratio in an OLED display device, there is single electrode, i.e., the anode electrode 19, in the opening region of the related art OLED display device. Since the storage capacitor, which is formed of an opaque metallic material, is disposed in an outer region of the opening region, the aperture ratio is reduced.

In the OLED display device, a buffer layer 10b (silicon oxide (SiO$_2$), 3000 Å), an interlayer insulating layer 8 (SiO$_2$, 4000 Å), a first passivation layer 90a (SiO$_2$, 3500 Å), a second passivation layer 90b (2.2 μm) and the anode electrode 19 (ITO, 1200 Å) are stacked on a substrate 10 in the opening region.

Figure 6B:
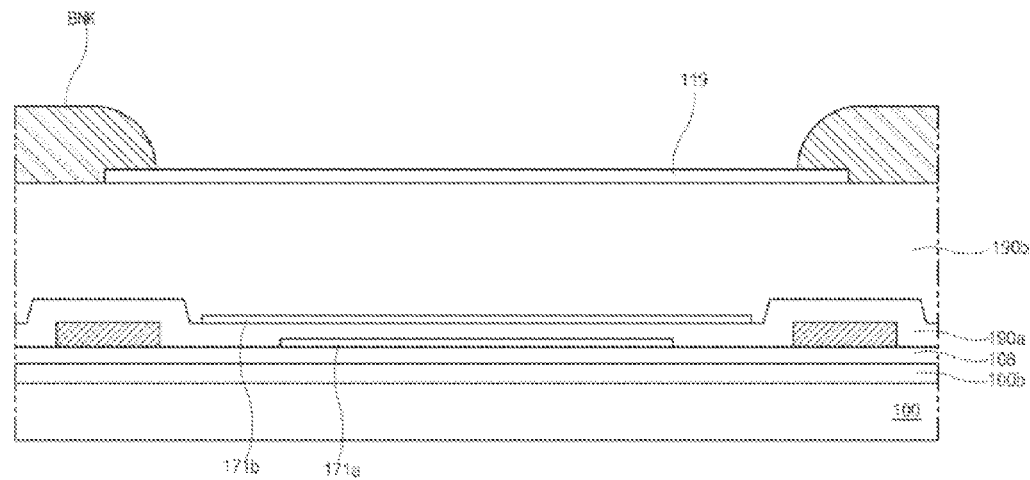

Referring to FIG. 6B, which is a cross-sectional view explaining the aperture ratio in an OLED display device according to the first embodiment, the storage capacitor including the first and second transparent capacitor electrodes 171a and 171b is disposed in the opening region such that the aperture ratio is increased.

In the array substrate for the OLED display device, a buffer layer 100b (SiO$_2$, 3000 Å), an interlayer insulating layer 108 (SiO$_2$, 4000 Å), the first transparent capacitor electrode 171a (ITO, 500 Å), a first passivation layer 190a (SiO$_2$), the second transparent capacitor electrode 171b (ITO, 500 Å), a second passivation layer 190b (2.2 μm) and the anode electrode 119 (ITO, 1200 Å) are stacked on a substrate 100 in the opening region. In comparison to the related art OLED display device, there is more layers, by which the light may be refracted, such that the optical property may be changed.

However, referring to Table 1 below, the change of the optical property is little such that the OLED display device according to the first embodiment has similar optical properties as the OLED display device in FIG. 6A.

TABLE 1

| | Thickness of the first passivation layer | | | | |
| --- | --- | --- | --- | --- | --- |
| | Comparison | (A) 3000 Å | (B) 3500 Å | (C) 4000 Å | (D) 4500 Å |
| cd/A | 67.06 | 65.51 | 65.89 | 66.78 | 66.15 |
| CIE, (x, y) | (0.3342, 0.3671) | (0.3354, 0.3668) | (0.3340, 0.3663) | (0.3370, 0.3722) | (0.3384, 0.3716) |
| Δu'v'(60°) | 0.014 | 0.015 | 0.020 | 0.012 | 0.015 |

In the above Table 1, the first passivation layer in the OLED display device of "Comparison", i.e., the device in FIG. 6A, is formed of silicon oxide (SiO$_2$) and has a thickness of 3500 Å, and the OLED display devices of "(A) 3000 Å", "(B) 3500 Å", "(C) 4000 Å" and "(D) 4500 Å" has a structure of the first embodiment and has a difference in the thickness of the first embodiment. Namely, the first passivation layer 190a in the "(A) 3000 Å" device is formed of SiO$_2$ and has the thickness of 3000 Å, and the first passivation layer 190a in the "(B) 3500 Å" device is formed of SiO$_2$ and has the thickness of 3500 Å. The first passivation layer 190a in the "(C) 4000 Å" device is formed of SiO$_2$ and has the thickness of 4000 Å, and the first passivation layer 190a in the "(D) 4500 Å" device is formed of SiO$_2$ and has the thickness of 4500 Å.

Figure 6C:
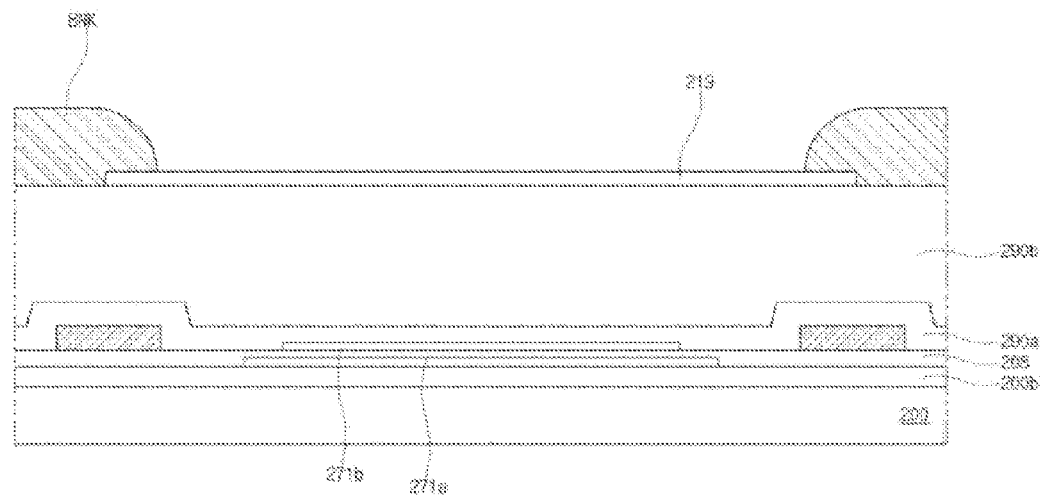

Referring to FIG. 6C, which is a cross-sectional view explaining the aperture ratio in an OLED display device according to the second embodiment, the storage capacitor including the first and second transparent capacitor electrodes 271a and 271b is disposed in the opening region such that the aperture ratio is increased.

In the array substrate for the OLED display device, a buffer layer 200b (SiO$_2$, 3000 Å), the first transparent capacitor electrode 271a (IGZO, 650 Å), an interlayer insulating layer 208 (SiO$_2$, 4800 Å), the second transparent capacitor electrode 271b (ITO, 500 Å), a first passivation layer 290a (SiO$_2$, 4000 Å), a second passivation layer 290b (2.2 μm) and the anode electrode 219 (ITO, 1150 Å) are stacked on a substrate 200 in the opening region. In comparison to the OLED display device in FIG. 6A, there is more layers, by which the light may be refracted, such that the optical property may be changed.

However, the change of the optical property is little such that the OLED display device according to the second embodiment has similar optical properties as the OLED display device in FIG. 6A and the OLED display device of the first embodiment.

In OLED display device in FIG. 6A, since there is single electrode, i.e., the anode electrode 19, transmittance of the OLED display device is relatively high. Namely, when the OLED display device is operated by applying a voltage to the anode electrode 19, the brightness of 67.06 cd/A is measured.

On the other hand, the brightness of 65.51 cd/A is measured in the "(A) 3000 Å" device, and the brightness of 65.89 cd/A is measured in the "(B) 3500 Å" device. The brightness of 66.78 cd/A is measured in the "(C) 4000 Å" device, and the brightness of 66.15 cd/A is measured in the "(D) 4500 Å" device.

Namely, the brightness of the OLED display devices is very similar, and the OLED display devices have substantially the same optical efficiency. Particularly, the brightness of 66.78 cd/A in the "(C) 4000 Å" device has a difference of 0.32 cd/A from the brightness of the related art OLED display device.

In addition, in the same structure except the first transparent capacitor electrode of the second embodiment and the second transparent capacitor electrode of the first embodiment, the OLED display device of the second embodiment including the first transparent capacitor electrode, which is formed of IGZO and has a thickness of 650 Å, has the brightness of 69.15 cd/A, and the OLED display device of the first embodiment including the second transparent capacitor electrode, which is formed of ITO and has a thickness of 500 Å, has the brightness of 70.79 cd/A Namely, the OLED display devices of the first and second embodiments have substantially the same brightness.

On the other hand, the OLED display device in FIG. 6A has CIE(x, y) of (0.3342, 0.3671).

In the OLED display device of the first embodiment of the present invention, CIE(x, y) of (0.3354, 0.3668) is measured in the "(A) 3000 Å" device, and CIE(x, y) of (0.3340, 0.3663) is measured in the "(B) 3500 Å" device. CIE(x, y) of (0.3370, 0.3722) is measured in the "(C) 4000 Å" device, and CIE(x, y) of (0.3384, 0.3716) is measured in the "(D) 4500 Å" device.

Namely, the color coordinate index of the OLED display devices is very similar. Particularly, the color coordinate index in the "(B) 3500 Å" device has a difference of (0.0008, 0.0008) from the color coordinate index of the related art OLED display device.

On the other hand, in the related art OLED display device, the CIE UCS UV color coordinate index difference ($\Delta$ u'v') between an edge viewing angle, which is perpendicular to a front viewing angle, and a side viewing angle, which has an angle of 60 degree with respect to the front viewing angle, in the related art OLED display device is 0.014.

In the OLED display device of the first embodiment of the present invention, the $\Delta$ u'v' of 0.015 is measured in the "(A) 3000 Å" device, and the $\Delta$ u'v' of 0.020 is measured in the "(B) 3500 Å" device. The $\Delta$ u'v' of 0.012 is measured in the "(C) 4000 Å" device, and the $\Delta$ u'v' of 0.015 is measured in the "(D) 4500 Å" device.

Namely, the CIE UCS UV color coordinate index difference ($\Delta$ u'v') of the OLED display devices is very similar regardless the thickness of the first passivation layer.

Consequently, the OLED display device including the array substrate of the present invention has substantially the same properties in the brightness, the color purity and the color shift as the related art OLED display device, while the OLED display device including the array substrate of the present invention has the improved aperture ratio and capacitance in comparison to the related art OLED display device.

Figure 7:
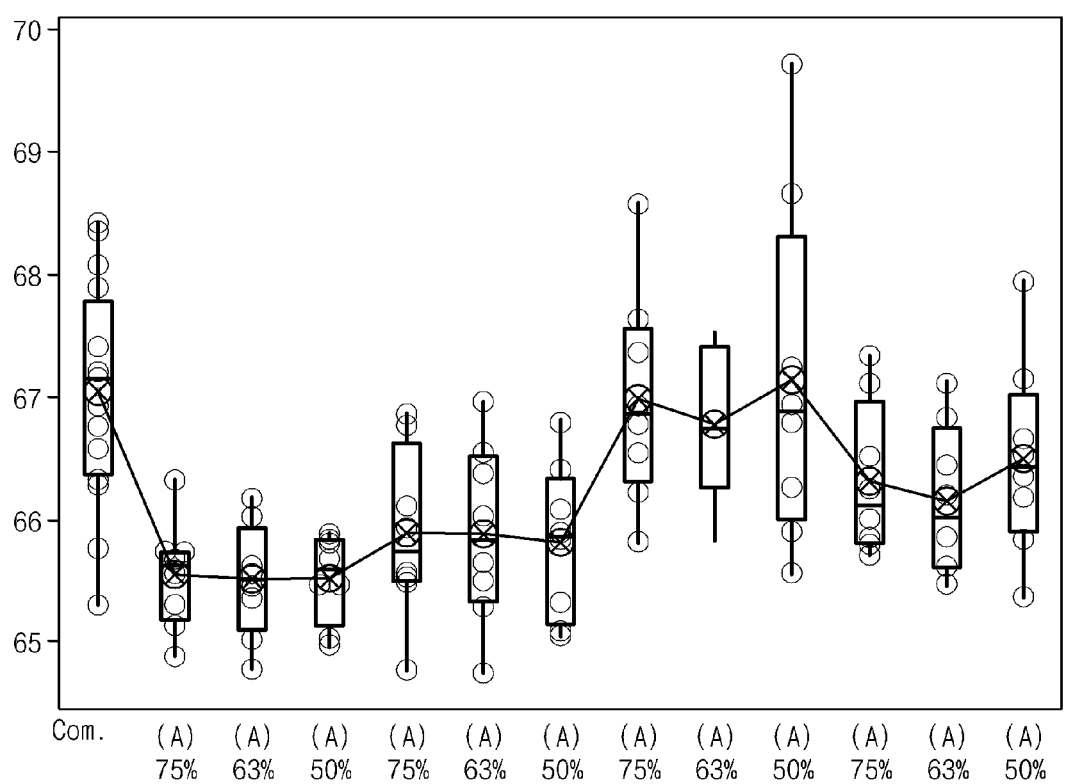
FIG. 7 is a graph showing brightness according to an area of a storage capacitor in the array substrate for the OLED display device according to the first embodiment.
Figure 8A:
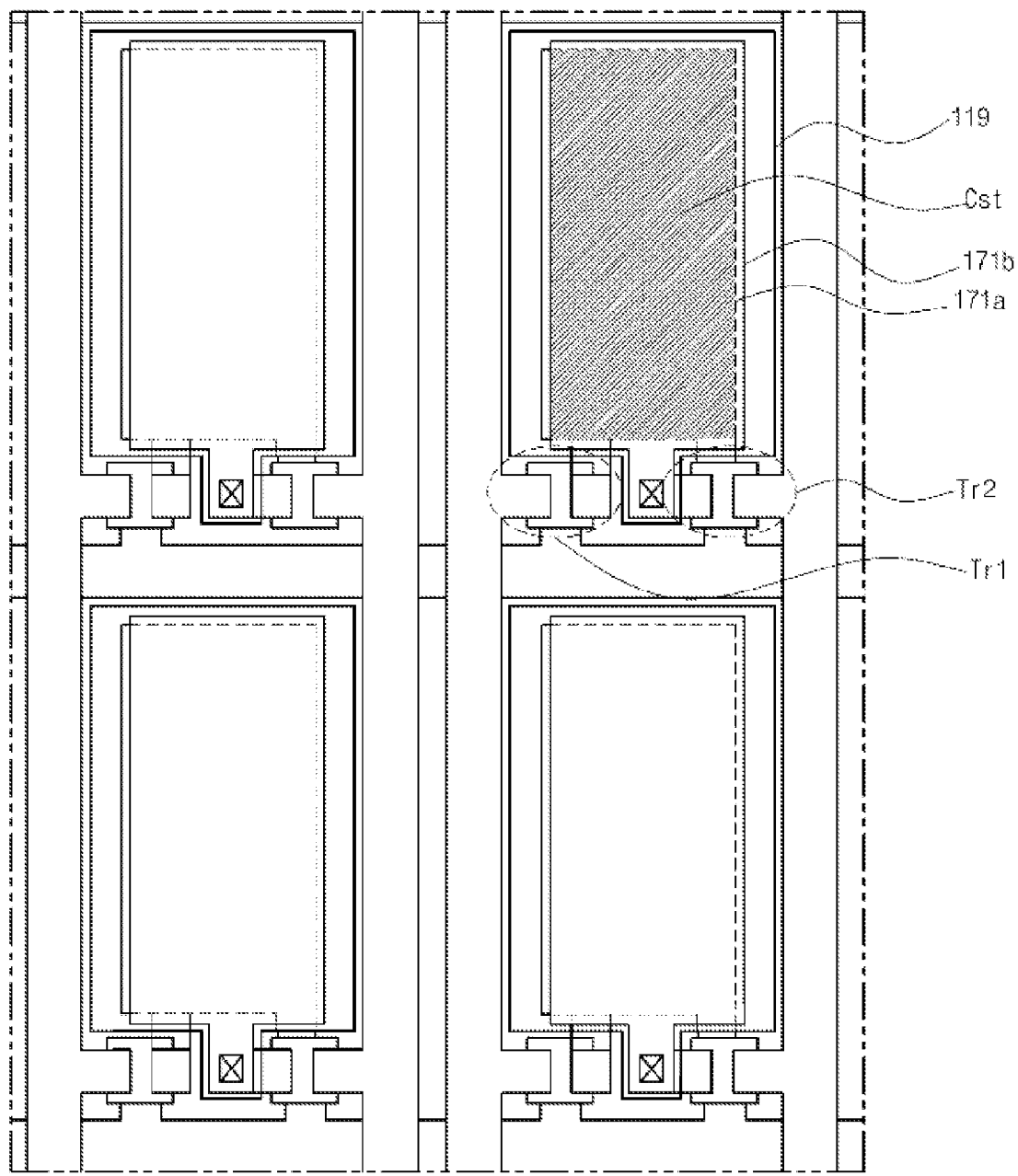
FIGS. 8A to 8C are plane views of an array substrate including a storage capacitor with different areas, respectively.
Figure 8B:
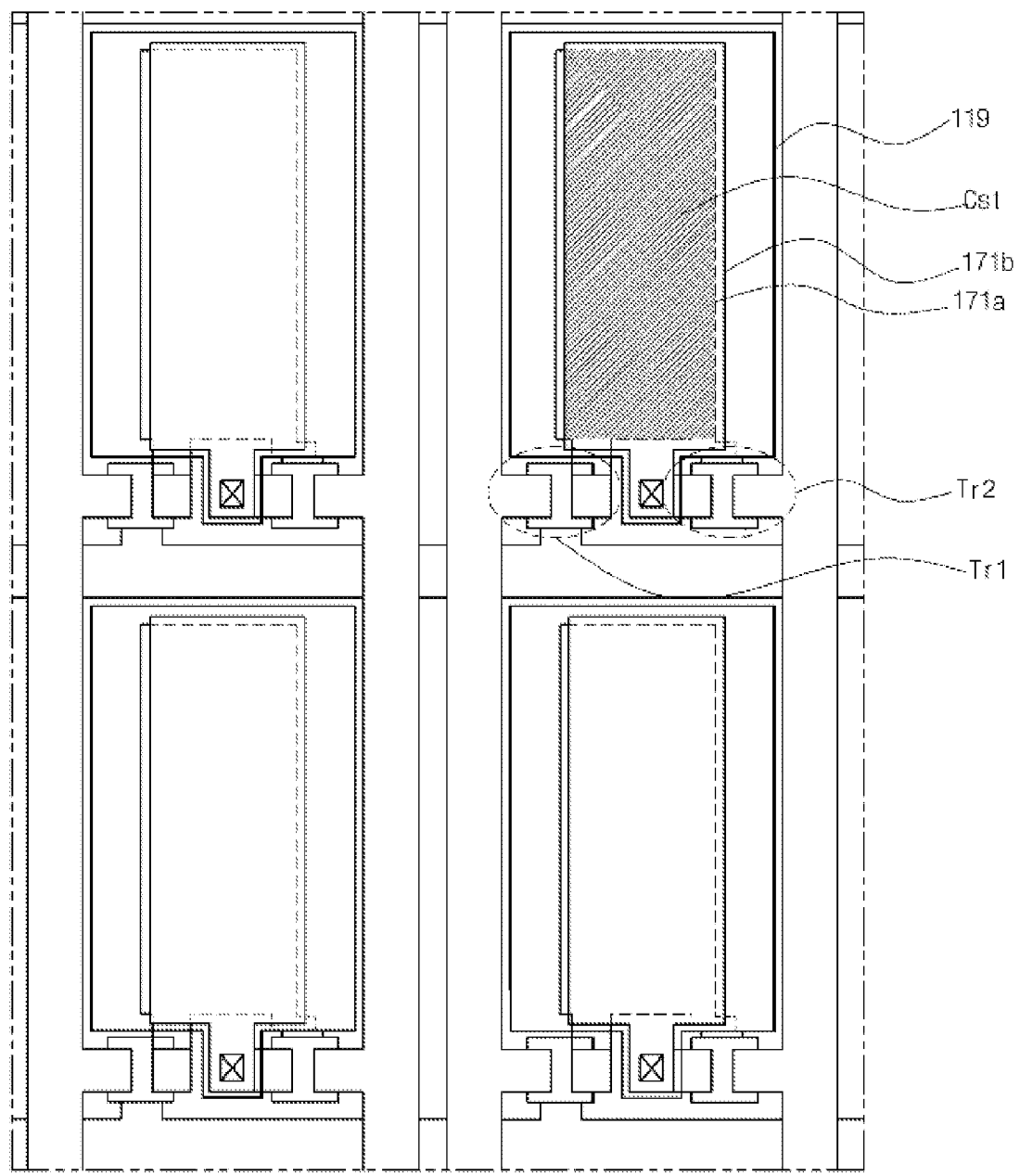
Figure 8C:
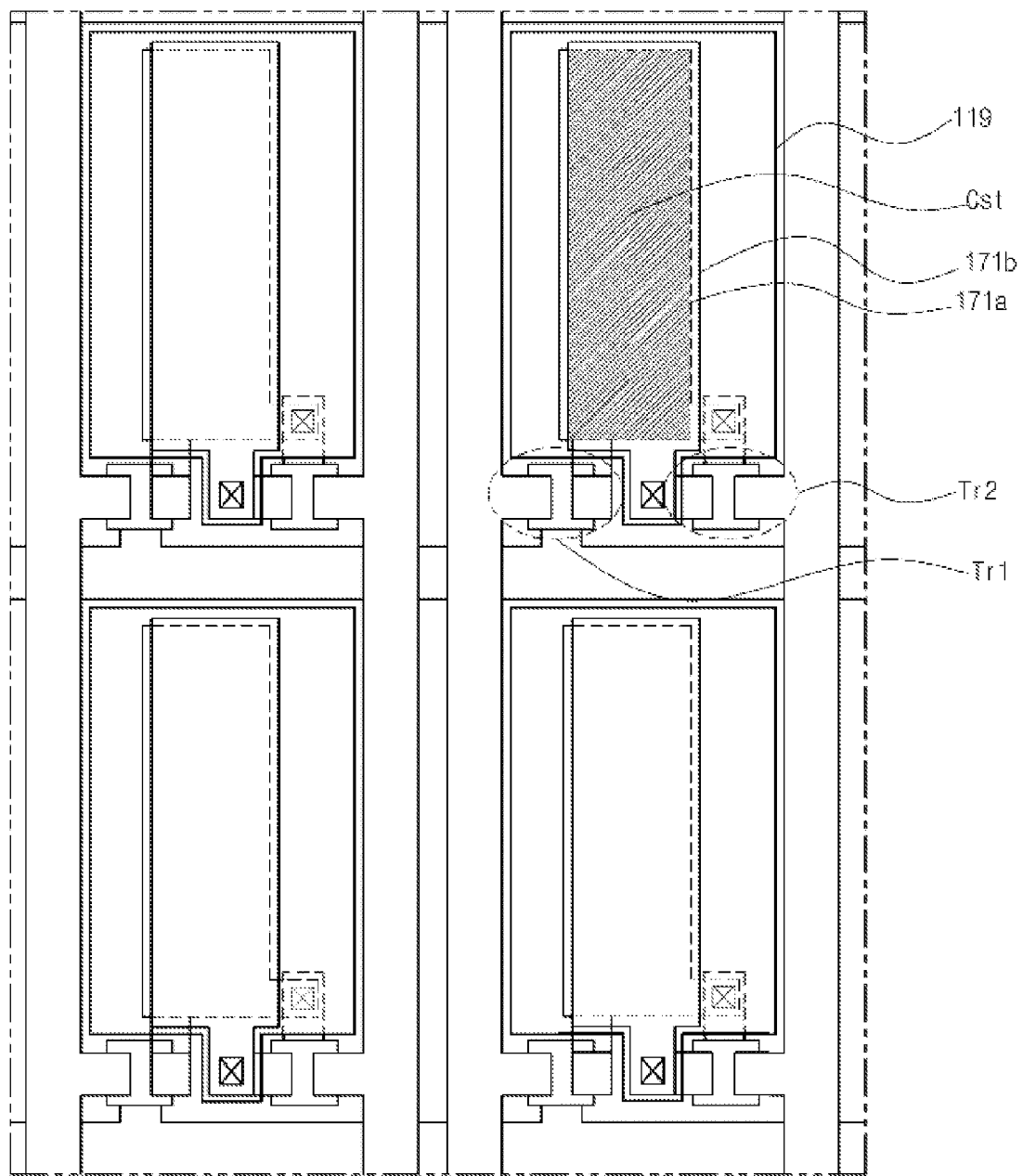

FIG. 7 is a graph showing brightness according to an area of a storage capacitor in the array substrate for the OLED display device according to the first embodiment. In FIG. 7, the vertical axis is the brightness percentage of the OLED display device in comparison to the light from an organic emitting layer. The circle mark is the brightness in the visible ray wavelengths, and the box mark is the main brightness range in the visible ray. The line mark is the average brightness. The indexes "(A)", "(B)", "(C)" and "(D)" are the devices in the above Table 1, and the indexes "75%", "63%" and "50%" is a ratio of an occupied area of the storage capacitor to an area of the aperture ratio as respectively shown in FIGS. 8A to 8C.

In FIG. 7, in the related OLED display device "Corn", about 67.2% light is provided from the OLED display device in comparison to the light emitted from the organic emitting layer.

In the "(A)75%" OLED display device, where the first passivation layer has a thickness of 3000 Å and the area of the storage capacitor is 75% of the aperture ratio, about 65.6% light is provided from the OLED display device in comparison to the light emitted from the organic emitting layer. In the "(A)63%" OLED display device, where the first passivation layer has a thickness of 3000 Å and the area of the storage capacitor is 63% of the aperture ratio, about 65.4% light is provided from the OLED display device in comparison to the light emitted from the organic emitting layer. In the "(A) 50%" OLED display device, where the first passivation layer has a thickness of 3000 Å and the area of the storage capacitor is 50% of the aperture ratio, about 65.5% light is provided from the OLED display device in comparison to the light emitted from the organic emitting layer.

In the "(B)75%" OLED display device, where the first passivation layer has a thickness of 3500 Å and the area of the storage capacitor is 75% of the aperture ratio, about 65.7% light is provided from the OLED display device in comparison to the light emitted from the organic emitting layer. In the "(B)63%" OLED display device, where the first passivation layer has a thickness of 3500 Å and the area of the storage capacitor is 63% of the aperture ratio, about 65.7% light is provided from the OLED display device in comparison to the light emitted from the organic emitting layer. In the "(B)50%" OLED display device, where the first passivation layer has a thickness of 3500 Å and the area of the storage capacitor is 50% of the aperture ratio, about 65.6% light is provided from the OLED display device in comparison to the light emitted from the organic emitting layer.

In the "(C)75%" OLED display device, where the first passivation layer has a thickness of 4000 Å and the area of the storage capacitor is 75% of the aperture ratio, about 66.8% light is provided from the OLED display device in comparison to the light emitted from the organic emitting layer. In the "(C)63%" OLED display device, where the first passivation layer has a thickness of 4000 Å and the area of the storage capacitor is 63% of the aperture ratio, about 66.7% light is provided from the OLED display device in comparison to the light emitted from the organic emitting layer. In the "(C)50%" OLED display device, where the first passivation layer has a thickness of 4000 Å and the area of the storage capacitor is 50% of the aperture ratio, about 66.7% light is provided from the OLED display device in comparison to the light emitted from the organic emitting layer.

In the "(D)75%" OLED display device, where the first passivation layer has a thickness of 4500 Å and the area of the storage capacitor is 75% of the aperture ratio, about 66.1% light is provided from the OLED display device in comparison to the light emitted from the organic emitting layer. In the "(D)63%" OLED display device, where the first passivation layer has a thickness of 4500 Å and the area of the storage capacitor is 63% of the aperture ratio, about 66% light is provided from the OLED display device in comparison to the light emitted from the organic emitting layer. In the "(D) 50%" OLED display device, where the first passivation layer has a thickness of 4500 Å and the area of the storage capacitor is 50% of the aperture ratio, about 66.4% light is provided from the OLED display device in comparison to the light emitted from the organic emitting layer.

Namely, the brightness percentage of the OLED display device of the first and second embodiments with respect to the light from an organic emitting layer is substantially the same as the related art OLED display device. In addition, the brightness percentage of the OLED display device with respect to the light from an organic emitting layer is substantially the same as each other regardless the occupied area of the storage capacitor. The brightness of the OLED display device depends on the thickness of the first passivation layer than the occupied area of the storage capacitor. Accordingly, referring to the above experimental data and considering the properties of the brightness, the color purity and the color shift, the first passivation layer may have a thickness of about 3500 to 4500 Å, and more beneficially about 3500 to 4000 Å.

The storage capacitor includes the first and second transparent capacitor electrodes such that the capacitance of the storage capacitor is increased without decrease the aperture ratio. In addition, since the area for the storage capacitor is used as a display area, the aperture ratio is increased.

Since the first and second transparent capacitor electrodes are disposed in the opening region, i.e., the display area or the aperture, the brightness, i.e., the luminance, from the surface of the OLED display device may be decreased. However, since the aperture ratio is increased than the related art OLED display device, the illuminance is increased.

The array substrate described herein has been described for use in an OLED display device. However, it is not limited to use in an OLED devices. For example, the array substrate can also be used for other types of display devices, e.g., a liquid crystal display (LCD) device.

It will be apparent to those skilled in the art that various modifications and variations can be made without departing from the spirit or scope of the invention.

What is claimed is:

1. An array substrate for a display device, comprising:
a first thin film transistor (TFT) including a first semiconductor layer, a first gate electrode corresponding to the first semiconductor layer, a first source electrode and a first drain electrode;
a second TFT including a second semiconductor layer, a second gate electrode corresponding to the second semiconductor layer, a second source electrode and a second drain electrode;
a first transparent capacitor electrode connected to the first drain electrode;
a first passivation layer on the first transparent capacitor electrode;
a second transparent capacitor electrode on the first passivation layer and directly connected to the second drain electrode, the second transparent capacitor electrode overlapping the first transparent capacitor electrode;
a second passivation layer on or over the second transparent capacitor electrode;
a first electrode on the second passivation layer and connected to the second transparent capacitor electrode;
an organic emitting layer on the first electrode; and
a second electrode on the organic emitting layer.

2. The array substrate according to claim 1, wherein the first drain electrode includes a transparent layer and a metal layer on the transparent layer, and the first transparent capacitor electrode extends from the transparent layer.

3. The array substrate according to claim 2, wherein the transparent layer includes indium-tin-oxide.

4. The array substrate according to claim 2, wherein each of the first source electrode, the second source electrode and the second drain electrode includes the transparent layer and the metal layer.

5. The array substrate according to claim 1, further comprising a color filter between the first and second passivation layers.

6. An array substrate for a display device, comprising:
a first thin film transistor (TFT) including a first semiconductor layer, a first gate electrode corresponding to the first semiconductor layer, a first source electrode and a first drain electrode;
a second TFT including a second semiconductor layer, a second gate electrode corresponding to the second semiconductor layer, a second source electrode and a second drain electrode;
a first transparent capacitor electrode connected to the first drain electrode or the first semiconductor layer;
an interlayer insulating layer on the first transparent capacitor electrode;
a second transparent capacitor electrode on the interlayer insulating layer and directly connected to the second drain electrode, the second transparent capacitor electrode overlapping the first transparent capacitor electrode;
a first passivation layer on or over the second transparent capacitor electrode;
a first electrode on the first passivation layer and connected to the second drain electrode;
an organic emitting layer on the first electrode; and
a second electrode on the organic emitting layer.

7. The array substrate according to claim 6, wherein the first transparent capacitor electrode is disposed at the same layer and includes the same material as the first and second semiconductor layers.

8. The array substrate according to claim 7, wherein the first transparent capacitor electrode includes an indium-gallium-zinc-oxide layer.

9. The array substrate according to claim 6, further comprising:
a second passivation layer between the first passivation layer and the second transparent capacitor electrode; and
a color filter between the first and second passivation layers.

10. An array substrate for a display device, comprising:
a first thin film transistor (TFT) including a first semiconductor layer, a first gate electrode corresponding to the first semiconductor layer, a first source electrode and a first drain electrode;
a second TFT including a second semiconductor layer, a second gate electrode corresponding to the second semiconductor layer, a second source electrode and a second drain electrode;
a first transparent capacitor electrode connected to the first drain electrode or the first semiconductor layer;

an interlayer insulating layer on the first transparent capacitor electrode;

a second transparent capacitor electrode on the interlayer insulating layer and connected to the second drain electrode, the second transparent capacitor electrode overlapping the first transparent capacitor electrode;

a first passivation layer on or over the second transparent capacitor electrode; and a first electrode on the first passivation layer and connected to the second drain electrode, wherein the second drain electrode includes a transparent layer and a metal layer on the transparent layer, and the second transparent capacitor electrode extends from the transparent layer, and wherein the second transparent capacitor electrode is disposed between the first transparent capacitor electrode and the first electrode.

11. The array substrate according to claim 10, wherein the transparent layer includes indium-tin-oxide.

12. The array substrate according to claim 10, wherein each of the first source electrode, the second source electrode and the second drain electrode includes the transparent layer and the metal layer.

13. An array substrate for a display device, comprising:

a first thin film transistor (TFT) including a first semiconductor layer, a first gate electrode corresponding to the first semiconductor layer, a first source electrode and a first drain electrode;

a second TFT including a second semiconductor layer, a second gate electrode corresponding to the second semiconductor layer, a second source electrode and a second drain electrode;

a first transparent capacitor electrode electrically coupled to at least one of the first drain electrode and the first semiconductor layer;

a first nonconductive layer on the first transparent capacitor electrode;

a second transparent capacitor electrode on the first nonconductive layer overlapping the first transparent capacitor electrode, the second transparent capacitor electrode directly connected to the second drain electrode;

a second nonconductive layer on or over at least the second transparent capacitor electrode;

a first electrode on the second nonconductive layer and electrically coupled to at least one of the second transparent capacitor electrode and the second drain electrode;

an organic emitting layer on the first electrode; and a second electrode on the organic emitting layer.

14. The array substrate according to claim 13, wherein the organic emitting layer overlaps the first and second transparent capacitor electrodes.

15. The array substrate according to claim 13, wherein the first nonconductive layer is a first passivation layer and the second nonconductive layer is a second passivation layer.

16. The array substrate according to claim 13, wherein the second nonconductive layer is also on or over the first passivation layer.

17. The array substrate according to claim 13, wherein the first nonconductive layer is an interlayer insulating layer and the second nonconductive layer is a first passivation layer.

18. The array substrate according to claim 13, wherein the second nonconductive layer is also on or over at least the first and second TFTs.

* * * * *